United States Patent
Amiya et al.

(10) Patent No.: US 10,455,773 B2
(45) Date of Patent: Oct. 29, 2019

(54) LIGHT EMITTING DEVICE AND PLANT CULTIVATION METHOD

(71) Applicant: NICHIA CORPORATION, Anan-shi, Tokushima (JP)

(72) Inventors: Mika Amiya, Naruto (JP); Kazushige Fujio, Tokushima (JP); Tomokazu Suzuki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 193 days.

(21) Appl. No.: 15/634,401

(22) Filed: Jun. 27, 2017

(65) Prior Publication Data

US 2018/0000016 A1    Jan. 4, 2018

(30) Foreign Application Priority Data

Jun. 29, 2016 (JP) .................................. 2016-128835

(51) Int. Cl.
| | |
|---|---|
| *A01G 7/04* | (2006.01) |
| *A01G 31/00* | (2018.01) |
| *H01L 33/50* | (2010.01) |
| *A01G 22/00* | (2018.01) |

(52) U.S. Cl.
CPC ............. *A01G 7/045* (2013.01); *A01G 22/00* (2018.02); *A01G 31/00* (2013.01); *H01L 33/504* (2013.01); *H01L 2224/48247* (2013.01); *H01L 2224/48257* (2013.01); *H01L 2224/73265* (2013.01); *Y02P 60/149* (2015.11)

(58) Field of Classification Search
CPC ................................ A01G 7/045; A01G 22/00
See application file for complete search history.

(56) References Cited

U.S. PATENT DOCUMENTS

| | | | |
|---|---|---|---|
| 2010/0259190 A1 | 10/2010 | Aikala | |
| 2014/0215918 A1* | 8/2014 | Takeuchi | A01G 7/045 |
| | | | 47/58.1 LS |

FOREIGN PATENT DOCUMENTS

| | | | |
|---|---|---|---|
| EP | 2727458 A1 | 5/2014 | |
| JP | 2001-352101 A | 12/2001 | |
| JP | 2009-125007 A | 6/2009 | |

(Continued)

OTHER PUBLICATIONS

Extended European Search Report in EP application No. 17178129 dated Dec. 6, 2017, 10 pages.

*Primary Examiner* — Andrew J Coughlin
(74) *Attorney, Agent, or Firm* — Hunton Andrews Kurth LLP

(57) ABSTRACT

Provided is a light emitting device that includes a light emitting element having a light emission peak wavelength ranging from 380 nm to 490 nm, and a fluorescent material excited by light from the light emitting element and emitting light having at a light emission peak wavelength ranging from 580 nm or more to less than 680 nm. The light emitting device emits light having a ratio R/B of a photon flux density R to a photon flux density B ranging from 2.0 to 4.0 and a ratio R/FR of the photon flux density R to a photon flux density FR ranging from 0.7 to 13.0, the photon flux density R being in a wavelength range of 620 nm or more and less than 700 nm, the photon flux density B being in a wavelength range of 380 nm or more and 490 nm or less, and the photon flux density FR being in a wavelength range of 700 nm or more and 780 nm or less.

6 Claims, 4 Drawing Sheets

(56) References Cited

FOREIGN PATENT DOCUMENTS

| | | |
|---|---|---|
| JP | 2016-504044 A | 2/2016 |
| JP | 2016-111190 A | 6/2016 |
| WO | 2010053341 A1 | 5/2010 |
| WO | 2014-103671 A1 | 7/2014 |

* cited by examiner

LIGHT EMITTING DEVICE AND PLANT CULTIVATION METHOD

CROSS-REFERENCE TO RELATED APPLICATION

The application claims benefit of Japanese Patent Application No. 2016-128835 filed on Jun. 29, 2016, the entire disclosure of which is hereby incorporated by reference in its entirety.

BACKGROUND

Technical Field

The present disclosure relates to a light emitting device and a plant cultivation method.

Description of Related Art

With environmental changes due to climate change and other artificial disruptions, plant factories are expected to increase production efficiency of vegetables and be capable of adjusting production in order to make it possible to stably supply vegetables. Plant factories that are capable of artificial management can stably supply clean and safe vegetables to markets, and therefore are expected to be the next-generation industries.

Plant factories that are completely isolated from external environment make it possible to artificially control and collect various data such as growth method, growth rate data, yield data, depending on classification of plants. Based on those data, plant factories are able to plan production according to the balance between supply and demand in markets, and supply plants such as vegetables without depending on surrounding conditions such as climatic environment. Particularly, an increase in food production is indispensable with world population growth. If plants can be systematically produced without the influence by surrounding conditions such as climatic environment, vegetables produced in plant factories can be stably supplied within a country, and additionally can be exported abroad as viable products.

In general, vegetables that are grown outdoors get sunlight, grow while conducting photosynthesis, and are gathered. On the other hand, vegetables that are grown in plant factories are required to be harvested in a short period of time, or are required to grow in larger than normal sizes even in an ordinary growth period.

In plant factories, the light source used in place of sunlight affect a growth period, growth of plants. LED lighting is being used in place of conventional fluorescent lamps, from a standpoint of power consumption reduction.

For example, Japanese Unexamined Patent Publication No. 2009-125007 discloses a plant growth method. In this method, the plants is irradiated with light emitted from a first LED light emitting element and/or a second LED light emitting element at predetermined timings using a lighting apparatus including the first LED light emitting element emitting light having a wavelength region of 625 to 690 nm and the second LED light emitting element emitting light having a wavelength region of 420 to 490 nm in order to emit lights having sufficient intensities and different wavelengths from each other.

SUMMARY

However, even though plants are merely irradiated with lights having different wavelengths as in the plant growth method disclosed in Japanese Unexamined Patent Publication No. 2009-125007, the effect of promoting plant growth is not sufficient. Further improvement is required in promotion of plant growth.

Accordingly, an object of the present disclosure is to provide a light emitting device capable of promoting growth of plants and a plant cultivation method.

Means for solving the above problems are as follows, and the present disclosure includes the following embodiments.

A first embodiment of the present disclosure is a light emitting device including a light emitting element having a light emission peak wavelength in a range of 380 nm or more and 490 nm or less, and a fluorescent material that is excited by light from the light emitting element and emits light having at least one light emission peak wavelength in a range of 580 nm or more and less than 680 nm. The light emitting device emits light having a ratio R/B of a photon flux density R to a photon flux density B within a range of 2.0 or more and 4.0 or less, and a ratio R/FR of a photon flux density R to a photon flux density FR within a range of 0.7 or more and 13.0 or less, where the photon flux density R is the number of light quanta ($\mu$mol·m$^{-2}$·g$^{-1}$) incident per unit time and unit area in a wavelength range of 620 nm or more and less than 700 nm, the photon flux density B is the number of light quanta ($\mu$mol·m$^{-2}$·g$^{-1}$) incident per unit time and unit area in a wavelength range of 380 nm or more and 490 nm or less, and the photon flux density FR is the number of light quanta ($\mu$mol·m$^{-2}$·g$^{-1}$) incident per unit time and unit area in a wavelength range of 700 nm or more and 780 nm or less.

A second embodiment of the present disclosure is a plant cultivation method including irradiating plants with light from the light emitting device.

According to embodiments of the present disclosure, a light emitting device capable of promoting growth of plants and a plant cultivation method can be provided.

DETAILED DESCRIPTION

A light emitting device and a plant cultivation method according to the present invention will be described below based on an embodiment. However, the embodiment described below only exemplifies the technical concept of the present invention, and the present invention is not limited to the light emitting device and plant cultivation method described below. In the present specification, the relationship between the color name and the chromaticity coordinate, the relationship between the wavelength range of light and the color name of monochromatic light follows JIS Z8110.

Light Emitting Device

An embodiment of the present disclosure is a light emitting device including a light emitting element having a light emission peak wavelength in a range of 380 nm or more and 490 nm or less (hereinafter sometimes referred to as a "region of from near ultraviolet to blue color"), and a first fluorescent material emitting light having at least one light emission peak wavelength in a range of 580 nm or more and less than 680 nm by being excited by light from the light emitting element. The light emitting device emits light having a ratio R/B of a photon flux density R to a photon flux density B within a range of 2.0 or more and 4.0 or less, and a ratio R/FR of the photon flux density R to a photon flux density FR within a range of 0.7 or more and 13.0 or less, where the photon flux density R is the number of light quanta ($\mu mol \cdot m^{-2} \cdot g^{-1}$) incident per unit time and unit area in a wavelength range of 620 nm or more and less than 700 nm, the photon flux density B is the number of light quanta ($\mu mol \cdot m^{-2} \cdot g^{-1}$) incident per unit time and unit area in a wavelength range of 380 nm or more and 490 nm or less, and the photon flux density FR is the number of light quanta ($\mu mol \cdot m^{-2} \cdot g^{-1}$) incident per unit time and unit area in a wavelength range of 700 nm or more and 780 nm or less.

Figure 1:
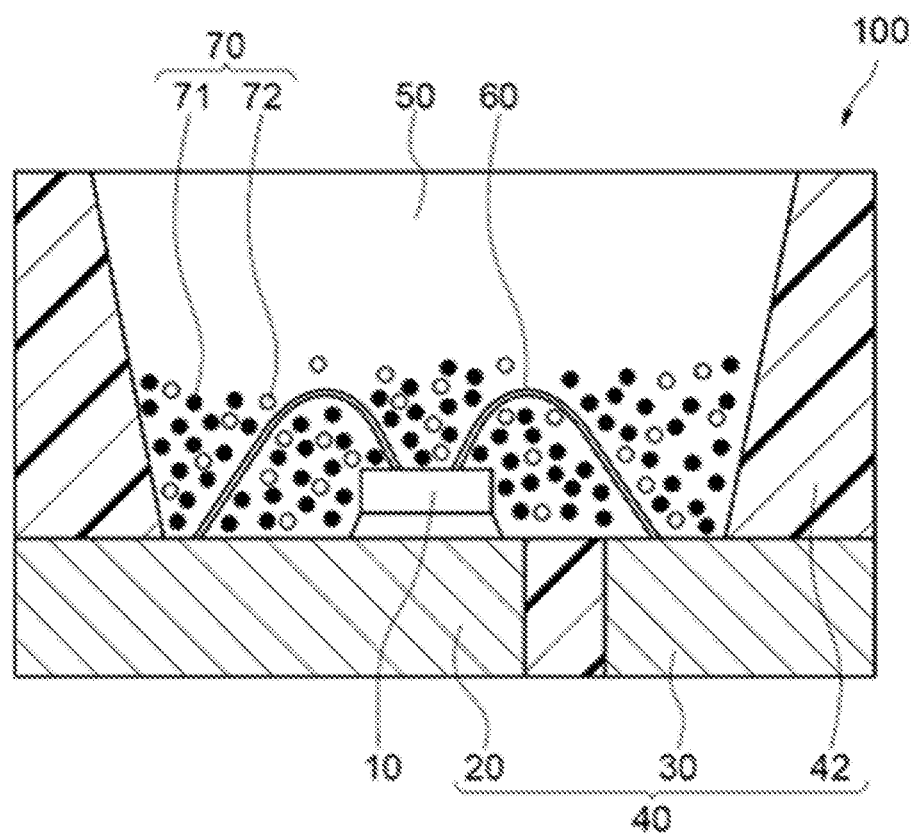
FIG. 1 is a schematic cross sectional view of a light emitting device according to an embodiment of the present disclosure.

An example of the light emitting device according to one embodiment of the present disclosure is described below based on the drawings. FIG. 1 is a schematic cross sectional view showing a light emitting device 100 according to an embodiment of the present disclosure.

The light emitting device 100 includes a molded article 40, a light emitting element 10 and a fluorescent member 50, as shown in FIG. 1. The molded article 40 includes a first lead 20 and a second lead 30 that are integrally molded with a resin portion 42 containing a thermoplastic resin or a thermosetting resin. The molded article 40 forms a depression having a bottom and sides, and the light emitting element 10 is placed on the bottom of the depression. The light emitting element 10 has a pair of an anode and a cathode, and the anode and the cathode are electrically connected to the first lead 20 and the second lead 30 respectively through the respective wires 60. The light emitting element 10 is covered with the fluorescent member 50. The fluorescent member 50 includes, for example, a fluorescent material 70 performing wavelength conversion of light from the light emitting element 10, and a resin. The fluorescent material 70 includes a first fluorescent material 71 and a second fluorescent material 72. A part of the first lead 20 and the second lead 30 that are connected to a pair of the anode and the cathode of the light emitting element 10 is exposed toward outside a package constituting the light emitting element 100. The light emitting device 100 can emit light by receiving electric power supply from the outside through the first lead 20 and the second lead 30.

The fluorescent member 50 not only performs wavelength conversion of light emitted from the light emitting element 10, but functions as a member for protecting the light emitting element 10 from the external environment. In FIG. 1, the fluorescent material 70 is localized in the fluorescent member 50 in the state that the first fluorescent material 71 and the second fluorescent material 72 are mixed with each other, and is arranged adjacent to the light emitting element 10. This constitution can efficiently perform the wavelength conversion of light from the light emitting element 10 in the fluorescent material 70, and as a result, can provide a light emitting device having excellent light emission efficiency.

The arrangement of the fluorescent member 50 containing the fluorescent material 70, and the light emitting element 10 is not limited to the embodiment that the fluorescent material 70 is arranged adjacent to the light emitting element 10 as shown in FIG. 1, and considering the influence of heat generated from the light emitting element 10, the fluorescent material 70 can be arranged separated from the light emitting element 10 in the fluorescent member 50. Furthermore, light having suppressed color unevenness can be emitted from the light emitting device 100 by arranging the fluorescent material 70 almost evenly in the fluorescent member 50. In FIG. 1, the fluorescent material 70 is arranged in the state that the first fluorescent material 71 and the second fluorescent material 72 are mixed with each other. However, for example, the first fluorescent material 71 may be arranged in a layer state and the second fluorescent material 72 may be arranged thereon in another layer state. Alternatively, the second fluorescent material 72 may be arranged in a layer state and the first fluorescent material 71 may be arranged thereon in another layer state.

The light emitting device 100 includes the first fluorescent material 71 having at least one light emission peak wavelength in a range of 580 nm or more and less than 680 nm by being excited by light from the light emitting element 10, and preferably further includes the second fluorescent material 72 having at least one light emission peak wavelength in a range of 680 nm or more and 800 nm or less by being excited by light from the light emitting element 10.

The first fluorescent material 71 and the second fluorescent material 72 are contained in, for example, the fluorescent member 50 covering the light emitting element 10. The light emitting device 100 in which the light emitting element 10 has been covered with the fluorescent member 50 containing the first fluorescent material 71 and the second fluorescent material 72 emits light having at least one light emission peak wavelength in a range of 580 nm or more and less than 680 nm by a part of light emission of the light emitting element 10 that is absorbed in the first fluorescent material 71. Furthermore, the light emitting device 100 emits light having at least one light emission peak wavelength in a range of 680 nm or more and 800 nm or less by a part of light emission of the light emitting element 10 that is absorbed in the second fluorescent material 72.

Plants grow when a pigment (chlorophyll a and chlorophyll b) present in chlorophyll thereof absorbs light and additionally takes carbon dioxide gas and water therein, and these are converted to carbohydrates (saccharides) by photosynthesis. Chlorophyll a and chlorophyll b used in growth promotion of plants particularly have absorption peaks in a red region of 625 nm or more and 675 nm or less and a blue region of 425 nm or more and 475 nm or less. The action of photosynthesis by chlorophylls of plants mainly occurs in a wavelength range of 400 nm or more and 700 nm or less, but chlorophyll a and chlorophyll b further have local absorption peaks in a region of 700 nm or more and 800 nm or less.

For example, when plants are irradiated with light having longer wavelength than and absorption peak (in the vicinity of 680 nm) in a red region of chlorophyll a, a phenomenon called red drop, in which activity of photosynthesis rapidly decreases, occurs. However, it is known that when plants are irradiated with light containing near infrared region together with light of red region, photosynthesis is accelerated by a synergistic effect of those two kinds of lights. This phenomenon is called the Emerson effect.

Intensity of light with which plants are irradiated is represented by photon flux density. The photon flux density ($\mu mol \cdot m^{-2} \cdot s^{-1}$) is the number of photons reaching a unit area per unit time. The amount of photosynthesis depends on the number of photons, and therefore does not depend on other optical characteristics if the photon flux density is the same. However, wavelength dependency activating photosynthesis differs depending on photosynthetic pigment. Intensity of light necessary for photosynthesis of plants is sometimes represented by Photosynthetic Photon Flux Density (PPFD).

The light emitting device 100 emits light having a ratio R/B of a photon flux density R to a photon flux density B within a range of 2.0 or more and 4.0 or less, and a ratio R/FR of the photon flux density R to a photon flux density FR within a range of 0.7 or more and 13.0 or less, where the photon flux density R is the number of light quanta ($\mu$mol·m$^{-2}$·g$^{-1}$) incident per unit time and unit area in a wavelength range of 620 nm or more and less than 700 nm, the photon flux density B is the number of light quanta ($\mu$mol·m$^{-2}$·g$^{-1}$) incident per unit time and unit area in a wavelength range of 380 nm or more and 490 nm or less, and the photon flux density FR is the number of light quanta ($\mu$mol·m$^{-2}$·g$^{-1}$) incident per unit time and unit area in a wavelength range of 700 nm or more and 780 nm or less.

It is estimated that in plants, which are irradiated with light containing the photon flux density FR from the light emitting device 100, photosynthesis is activated by Emerson effect, and as a result, growth of plants can be promoted. Furthermore, when plants are irradiated with light containing the photon flux density FR, growth of the plants can be promoted by a reversible reaction between red light irradiation, to which chlorophyll as chromoprotein contained in plants has participated, and far infrared light irradiation.

Examples of nutrients necessary for growth of plants include nitrogen, phosphoric acid, and potassium. Of those nutrients, nitrogen is absorbed in plants as nitrate nitrogen (nitrate ion: $NO_3^-$). The nitrate nitrogen changes into nitrite ion ($NO_2^-$) by a reduction reaction, and when the nitrite ion is further reacted with fatty acid amine, nitrosoamine is formed. It is known that nitrite ion acts to hemoglobin in blood, and it is known that a nitroso compound sometimes affects health of a human body. Mechanism of converting nitrate nitrogen into nitrite ion in vivo is complicated, and the relationship between the amount of intake of nitrate nitrogen and the influence to health of a human body is not clarified. However, it is desired that the content of nitrate nitrogen having a possibility of affecting health of a human body is smaller.

For the above reasons, nitrogen is one of nutrients necessary for growth of plants, but it is preferred that the content of nitrate nitrogen in food plants be reduced to a range that does not disturb the growth of plants.

It is preferred that the light emitting device 100 further include the second fluorescent material 72 having at least one light emission peak wavelength in a range of 680 nm or more and 800 nm or less by being excited by light from the light emitting element 10, wherein the R/FR ratio is within a range of 0.7 or more and 5.0 or less. The R/FR ratio is more preferably within a range of 0.7 or more and 2.0 or less.

Light Emitting Element

The light emitting element 10 is used as an excitation light source, and is a light emitting element emitting light having a light emission peak wavelength in a range of 380 nm or more and 490 nm or less. As a result, a stable light emitting device having high efficiency, high linearity of output to input and strong mechanical impacts can be obtained.

The range of the light emission peak wavelength of the light emitting element 10 is preferably in a range of 390 nm or more and 480 nm or less, more preferably in a range of 420 nm or more and 470 nm or less, and still more preferably in a range of 440 nm or more and 460 nm or less, and particularly preferably in a range of 445 nm or more and 455 nm or less. A light emitting element including a nitride semiconductor ($In_xAl_yGa_{1-x-y}N$, $0 \leq X$, $0 \leq Y$ and $X+Y \leq 1$) is preferably used as the light emitting element 10.

The half value width of emission spectrum of the light emitting element 10 can be, for example, 30 nm or less.

Fluorescent Member

The fluorescent member 50 used in the light emitting device 100 preferably includes the first fluorescent material 71 and a sealing material, and more preferably further includes the second fluorescent material 72. A thermoplastic resin and a thermosetting resin can be used as the sealing material. The fluorescent member 50 may contain other components such as a filler, a light stabilizer and a colorant, in addition to the fluorescent material and the sealing material. Examples of the filler include silica, barium titanate, titanium oxide and aluminum oxide.

The content of other components other than the fluorescent material 70 and the sealing material in the fluorescent member 50 is preferably in a range of 0.01 parts by mass or more and 20 parts by mass or less, per 100 parts by mass of the sealing material.

The total content of the fluorescent material 70 in the fluorescent member 50 can be, for example, 5 parts by mass or more and 300 parts by mass or less, per 100 parts by mass of the sealing material. The total content is preferably 10 parts by mass or more and 250 parts by mass or less, more preferably 15 parts by mass or more and 230 parts by mass or less, and still more preferably 15 parts by mass or more and 200 parts by mass or less. When the total content of the fluorescent material 70 in the fluorescent member 50 is within the above range, the light emitted from the light emitting element 10 can be efficiently subjected to wavelength conversion in the fluorescent material 70.

First Fluorescent Material

The first fluorescent material 71 is a fluorescent material that is excited by light from the light emitting element 10 and emits light having at least one light emission peak wavelength in a range of 580 nm or more and less than 680 nm. Examples of the first fluorescent material 71 include an $Mn^{4+}$-activated fluorogermanate fluorescent material, an $Eu^{2+}$-activated nitride fluorescent material, an $Eu^{2+}$-activated alkaline earth sulfide fluorescent material and an $Mn^{4+}$-activated halide fluorescent material. The first fluorescent material 71 may use one selected from those fluorescent materials and may use a combination of two or more thereof. The first fluorescent material preferably contains an $Eu^{2+}$-activated nitride fluorescent material and an $Mn^{4+}$-activated fluorogermanate fluorescent material.

The $Eu^{2+}$-activated nitride fluorescent material is preferably a fluorescent material that has a composition including at least one element selected from Sr and Ca, and Al and contains silicon nitride that is activated by $Eu^{2+}$, or a fluorescent material that has a composition including at least one element selected from the group consisting of alkaline earth metal elements and at least one element selected from the group consisting of alkali metal elements and contains aluminum nitride that is activated by $Eu^{2+}$.

The halide fluorescent material that is activated by $Mn^{4+}$ is preferably a fluorescent material that has a composition including at least one element or ion selected from the group consisting of alkali metal elements and an ammonium ion ($NH^{4+}$) and at least one element selected from the group consisting of Group 4 elements and Group 14 elements and contains a fluoride that is activated by $Mn^{4+}$.

Examples of the first fluorescent material 71 specifically include fluorescent materials having any one composition of the following formulae (I) to (VI).

$$(i-j)MgO \cdot (j/2)Sc_2O_3 \cdot kMgF_2 \cdot mCaF_2 \cdot (1-n)GeO_2 \cdot (n/2)M^t_2O_3:zMn^{4+} \quad (I)$$

wherein $M^t$ is at least one selected from the group consisting of Al, Ga, and In, and j, k, m, n, and z are numbers satisfying $2 \le i \le 4$, $0 \le j < 0.5$, $0 < k < 1.5$, $0 \le m < 1.5$, $0 < n < 0.5$, and $0 < z < 0.05$, respectively.

$$(Ca_{1-p-q}Sr_pEu_q)AlSiN_3 \quad (II)$$

wherein p and q are numbers satisfying $0 \le p \le 1.0$, $0 < q < 1.0$, and $p+q < 1.0$.

$$M^a{}_vM^b{}_wM^c{}_fAl_{3-g}Si_gN_h \quad (III)$$

wherein $M^a$ is at least one element selected from the group consisting of Ca, Sr, Ba, and Mg, $M^b$ is at least one element selected from the group consisting of Li, Na, and K, $M^c$ is at least one element selected from the group consisting of Eu, Ce, Tb, and Mn, v, w, f, g, and h are numbers satisfying $0.80 \le v \le 1.05$, $0.80 \le w \le 1.05$, $0.001 < f \le 0.1$, $0 \le g \le 0.5$, and $3.0 \le h \le 5.0$, respectively.

$$(Ca_{1-r-s-t}Sr_rBa_sEu_t)_2Si_5N_8 \quad (IV)$$

wherein r, s, and t are numbers satisfying $0 \le r \le 1.0$, $0 \le s \le 1.0$, $0 < t < 1.0$, and $r+s+t \le 1.0$.

$$(Ca,Sr)S:Eu \quad (V)$$

$$A_2[M^1{}_{1-u}Mn^{4+}{}_uF_6] \quad (VI)$$

wherein A is at least one selected from the group consisting of K, Li, Na, Rb, Cs, and $NH_4^+$, $M^1$ is at least one element selected from the group consisting of Group 4 elements and Group 14 elements, and u is the number satisfying $0 < u < 0.2$.

The content of the first fluorescent material 71 in the fluorescent member 50 is not particularly limited as long as the R/B ratio is within a range of 2.0 or more and 4.0 or less. The content of the first fluorescent material 71 in the fluorescent member 50 is, for example, 1 part by mass or more, preferably 5 parts by mass or more, and more preferably 8 parts by mass or more, per 100 parts by mass of the sealing material, and is preferably 200 parts by mass or less, more preferably 150 parts by mass or less, and still more preferably 100 parts by mass or less, per 100 parts by mass of the sealing material. When the content of the first fluorescent material 71 in the fluorescent member 50 is within the aforementioned range, the light emitted from the light emitting element 10 can be efficiently subjected to wavelength conversion, and light capable of promoting growth of plant can be emitted from the light emitting device 100.

The first fluorescent material 71 preferably contains at least two fluorescent materials, and in the case of containing at least two fluorescent materials, the first fluorescent material preferably contains a fluorogermanate fluorescent material that is activated by $Mn^{4+}$ (hereinafter referred to as "MGF fluorescent material"), and a fluorescent material that has a composition including at least one element selected from Sr and Ca, and Al, and contains silicon nitride that is activated by $Eu^{2+}$ (hereinafter referred to as "CASN fluorescent material").

In the case where the first fluorescent material 71 contains at least two fluorescent materials and two fluorescent materials are a MGF fluorescent material and a CASN fluorescent material, where a compounding ratio thereof (MGF fluorescent material:CASN fluorescent material) is preferably in a range of 50:50 or more and 99:1 or less, more preferably in a range of 60:40 or more and 97:3 or less, and still more preferably in a range of 70:30 or more and 96:4 or less, in mass ratio. In the case where the first fluorescent material contains two fluorescent materials, when those fluorescent materials are a MGF fluorescent material and a CASN fluorescent material and the mass ratio thereof is within the aforementioned range, the light emitted from the light emitting element 10 can be efficiently subjected to wavelength conversion in the first fluorescent material 71. In addition, the R/B ratio can be adjusted to within a range of 2.0 or more and 4.0 or less, and the R/FR ratio is easy to be adjusted to within a range of 0.7 or more and 13.0 or less.

Second Fluorescent Material

The second fluorescent material 72 is a fluorescent material that is excited by the light from the light emitting element 10 and emits light having at least one light emission peak wavelength in a range of 680 nm or more and 800 nm or less.

The second fluorescent material 72 used in the light emitting device according to one embodiment of the present disclosure is a fluorescent material that contains a first element Ln containing at least one element selected from the group consisting of rare earth elements excluding Ce, a second element M containing at least one element selected from the group consisting of Al, Ga, In, Ce, and Cr, and has a composition of an aluminate fluorescent material. When a molar ratio of the second element M is taken as 5, it is preferred that a molar ratio of Ce be a product of a value of a parameter x and 3, and a molar ratio of Cr be a product of a value of a parameter y and 3, wherein the value of the parameter x is in a range of exceeding 0.0002 and less than 0.50, and the value of the parameter y is in a range of exceeding 0.0001 and less than 0.05.

The second fluorescent material 72 is preferably a fluorescent material having the composition represented by the following formula (1):

$$(Ln_{1-x-y}Ce_xCr_y)_3M_5O_{12} \quad (1)$$

wherein Ln is at least one rare earth element selected from the group consisting of rare earth elements excluding Ce, M is at least one element selected from the group consisting of Al, Ga, and In, and x and y are numbers satisfying $0.0002 < x < 0.50$ and $0.0001 < y < 0.05$, respectively.

In this case, the second fluorescent material 72 has a composition constituting a garnet structure, and therefore is tough against heat, light, and water, has an absorption peak wavelength of excited absorption spectrum in the vicinity of 420 nm or more and 470 nm or less, and sufficiently absorbs the light from the light emitting element 10, thereby enhancing light emitting intensity of the second fluorescent material 72, which is preferred. Furthermore, the second fluorescent material 72 is excited by light having light emission peak wavelength in a range of 380 nm or more and 490 nm or less and emits light having at least one light emission peak wavelength in a range of 680 nm or more and 800 nm or less.

In the second fluorescent material 72, from the standpoint of stability of a crystal structure, Ln is preferably at least one rare earth element selected from the group consisting of Y, Gd, Lu, La, Tb, and Pr, and M is preferably Al or Ga.

In the second fluorescent material 72, the value of the parameter x is more preferably in a range of 0.0005 or more and 0.400 or less ($0.0005 \le x \le 0.400$), and still more preferably in a range of 0.001 or more and 0.350 or less ($0.001 \le x \le 0.350$).

In the second fluorescent material 72, the value of the parameter y is preferably in a range of exceeding 0.0005 and less than 0.040 ($0.0005 < y < 0.040$), and more preferably in a range of 0.001 or more and 0.026 or less ($0.001 \le y \le 0.026$).

The parameter x is an activation amount of Ce and the value of the parameter x is in a range of exceeding 0.0002 and less than 0.50 ($0.0002<x<0.50$), and the parameter y is an activation amount of Cr. When the value of the parameter y is in a range of exceeding 0.0001 and less than 0.05 ($0.0001<y<0.05$), the activation amount of Ce and the activation amount of Cr that are light emission centers contained in the crystal structure of the fluorescent material are within optimum ranges, the decrease of light emission intensity due to the decrease of light emission center can be suppressed, the decrease of light emission intensity due to concentration quenching caused by the increase of the activation amount can be suppressed, and light emission intensity can be enhanced.

Production Method of Second Fluorescent Material

A method for producing the second fluorescent material 72 includes the following method.

A compound containing at least one rare earth element Ln selected from the group consisting of rare earth elements excluding Ce, a compound containing at least one element M selected from the group consisting of Al, Ga, and In, a compound containing Ce and a compound containing Cr are mixed such that, when the total molar composition ratio of the M is taken as 5 as the standard, in the case where the total molar composition ratio of Ln, Ce, and Nd is 3, the molar ratio of Ce is a product of 3 and a value of a parameter x, and the molar ratio of Cr is a product of 3 and a value of a parameter y, the value of the parameter x is in a range of exceeding 0.0002 and less than 0.50 and the value of the parameter y is in a range of exceeding 0.0001 and less than 0.05, thereby obtaining a raw material mixture, the raw material mixture is heat-treated, followed by classification and the like, thereby obtaining the second fluorescent material.

Compound Containing Rare Earth Element Ln

Examples of the compound containing rare earth element Ln include oxides, hydroxides, nitrides, oxynitrides, fluorides, and chlorides, that contain at least one rare earth element Ln selected from the group consisting of rare earth elements excluding Ce. Those compounds may be hydrates. At least a part of the compounds containing rare earth element may use a metal simple substance or an alloy containing rare earth element. The compound containing rare earth element is preferably a compound containing at least one rare earth element Ln selected from the group consisting of Y, Gd, Lu, La, Tb, and Pr. The compound containing rare earth element may be used alone or may be used as a combination of at least two compounds containing rare earth element.

The compound containing rare earth element is preferably an oxide that does not contain elements other than the target composition, as compared with other materials. Examples of the oxide specifically include $Y_2O_3$, $Gd_2O_3$, $Lu_2O_3$, $La_2O_3$, $Tb_4O_7$ and $Pr_6O_{11}$.

Compound Containing M

Examples of the compound containing at least one element M selected from the group consisting of Al, Ga, and In include oxides, hydroxides, nitrides, oxynitrides, fluorides, and chlorides, that contain Al, Ga, or In. Those compounds may be hydrates. Furthermore, Al metal simple substance, Ga metal simple substance, In metal simple substance, Al alloy, Ga alloy or In alloy may be used, and metal simple substance or an alloy may be used in place of at least a part of the compound. The compound containing Al, Ga, or In may be used alone or may be used as a combination of two or more thereof. The compound containing at least one element selected from the group consisting of Al, Ga, and In is preferably an oxide. The reason for this is that an oxide that does not contain elements other than the target composition, as compared with other materials, and a fluorescent material having a target composition are easy to be obtained. When a compound containing elements other than the target composition has been used, residual impurity elements are sometimes present in the fluorescent material obtained. The residual impurity element becomes a killer factor in light emission, leading to the possibility of remarkable decrease of light emission intensity.

Examples of the compound containing Al, Ga, or In specifically include $Al_2O_3$, $Ga_2O_3$, and $In_2O_3$.

Compound Containing Ce and Compound Containing Cr

Examples of the compound containing Ce or the compound containing Cr include oxides, hydroxides, nitrides, fluorides, and chlorides, that contain cerium (Ce) or chromium (Cr). Those compounds may be hydrates. Ce metal simple substance, Ce alloy, Cr metal simple substance, or Cr alloy may be used, and a metal simple substance or an alloy may be used in place of a part of the compound. The compound containing Ce or the compound containing Cr may be used alone or may be used as a combination of two or more thereof. The compound containing Ce or the compound containing Cr is preferably an oxide. The reason for this is that an oxide that does not contain elements other than the target composition, as compared with other materials, and a fluorescent material having a target composition are easy to be obtained. When a compound containing elements other than the target composition has been used, residual impurity elements are sometimes present in the fluorescent material obtained. The residual impurity element becomes a killer factor in light emission, leading to the possibility of remarkable decrease of light emission intensity.

Example of the compound containing Ce specifically includes $CeO_2$, and example of the compound containing Cr specifically includes $Cr_2O_3$.

The raw material mixture may contain a flux such as a halide, as necessary. When a flux is contained in the raw material mixture, reaction of raw materials with each other is accelerated, and a solid phase reaction is easy to proceed further uniformly. It is considered that a temperature for heat-treating the raw material mixture is almost the same as a formation temperature of a liquid phase of a halide used as a flux or is a temperature higher than the formation temperature, and, as a result, the reaction is accelerated.

Examples of the halide include fluorides, chlorides of rare earth metals, alkali earth metals, and alkali metals. When a halide of rare earth metal is used as the flux, the flux can be added as a compound so as to achieve a target composition. Examples of the flux specifically include $BaF_2$ and $CaF_2$. Of those, $BaF_2$ is preferably used. When barium fluoride is used as the flux, a garnet crystal structure is stabilized and a composition of a garnet crystal structure is easy to be formed.

When the raw material mixture contains a flux, the content of the flux is preferably 20 mass % or less, and more preferably 10 mass % or less, and is preferably 0.1 mass % or more, on the basis of the raw material mixture (100 mass %). When the flux content is within the aforementioned range, the problem that it is difficult to form a garnet crystal structure due to the insufficiency of particle growth by small amount of the flux is prevented, and furthermore, the problem that it is difficult to form a garnet crystal structure due to too large amount of the flux is prevented.

The raw material mixture is prepared, for example, as follows. Each of raw materials is weighed so as to be a compounding ratio. Thereafter, the raw materials are subjected to mixed grinding using a dry grinding machine such as ball mill, are subjected to mixed grinding using a mortar and a pestle, are subjected to mixing using a mixing machine such as a ribbon blender, for example, or are subjected to mixed grinding using both a dry grinding machine and a mixing machine. As necessary, the raw material mixture may be classified using a wet separator such as a setting tank generally used industrially, or a dry classifier such as a cyclone. The mixing may be conducted by dry mixing or may be conducted by wet mixing by adding a solvent. The mixing is preferably dry mixing. The reason for this is that dry mixing can shorten a processing time as compared with wet drying, and this leads to the improvement of productivity.

The raw material mixture after mixing each raw material is dissolved in an acid, the resulting solution is co-precipitated in oxalic acid, a product formed by the co-precipitation is baked to obtain an oxide, and the oxide may be used as the raw material mixture.

The raw material mixture can be heat-treated by placing it in a crucible, a boat made of a carbon material (such as graphite), boron nitride (BN), aluminum oxide (alumina), tungsten (W) or molybdenum (Mo).

From the standpoint of stability of a crystal structure, the temperature for heat-treating the raw material mixture is preferably in a range of 1,000° C. or higher and 2,100° C. or lower, more preferably in a range of 1,100° C. or higher and 2,000° C. or lower, still more preferably in a range of 1,200° C. or higher and 1,900° C. or lower, and particularly preferably in a range of 1,300° C. or higher and 1,800° C. or lower. The heat treatment can use an electric furnace or a gas furnace.

The heat treatment time varies depending on a temperature rising rate, a heat treatment atmosphere. The heat treatment time after reaching the heat treatment temperature is preferably 1 hour or more, more preferably 2 hours or more, and still more preferably 3 hours or more, and is preferably 20 hours or less, more preferably 18 hours or less and still more preferably 15 hours or less.

The atmosphere for heat-treating the raw material mixture is an inert atmosphere such as argon or nitrogen, a reducing atmosphere containing hydrogen, or an oxidizing atmosphere such as the air. The raw material mixture may be subjected to a two-stage heat treatment of a first heat treatment of heat-treating in the air or a weakly reducing atmosphere from the standpoint of, for example, prevention of blackening, and a second heat treatment of heat-treating in a reducing atmosphere from the standpoint of enhancing absorption efficiency of light having a specific light emission peak wavelength. The fluorescent material constituting a garnet structure is that reactivity of the raw material mixture is improved in an atmosphere having high reducing power such as a reducing atmosphere. Therefore, the fluorescent material can be heat-treated under the atmospheric pressure without pressurizing. For example, the heat treatment can be conducted by the method disclosed in Japanese Patent Application No. 2014-260421.

The fluorescent material obtained may be subjected to post-treatment steps such as a solid-liquid separation by a method such as cleaning or filtration, drying by a method such as vacuum drying, and classification by dry sieving. After those post-treatment steps, a fluorescent material having a desired average particle diameter is obtained.

Other Fluorescent Materials

The light emitting device 100 may contain other kinds of fluorescent materials, in addition to the first fluorescent material 71.

Examples of other kinds of fluorescent materials include a green fluorescent material emitting green color by absorbing a part of the light emitted from the light emitting element 10, a yellow fluorescent material emitting yellow color, and a fluorescent material having a light emission peak wavelength in a wavelength range exceeding 680 nm.

Examples of the green fluorescent material specifically include fluorescent materials having any one of compositions represented by the following formulae (i) to (iii).

$$M^{11}_8MgSi_4O_{16}X^{11}:Eu \quad \text{(i)}$$

wherein $M^{11}$ is at least one selected from the group consisting of Ca, Sr, Ba, and Zn, and $X^{11}$ is at least one selected from the group consisting of F, Cl, Br, and I.

$$Si_{6-b}Al_bO_bN_{8-b}:Eu \quad \text{(ii)}$$

wherein b satisfies 0<b<4.2.

$$M^{13}Ga_2S_4:Eu \quad \text{(iii)}$$

wherein $M^{13}$ is at least one selected from the group consisting of Mg, Ca, Sr, and Ba.

Examples of the yellow fluorescent material specifically include fluorescent materials having any one of compositions represented by the following formulae (iv) to (v).

$$M^{14}_{c/d}Si_{12-(c+d)}Al_{(c+d)}O_dN_{(16-d)}:Eu \quad \text{(iv)}$$

wherein $M^{14}$ is at least one selected from the group consisting of Sr, Ca, Li, and Y. A value of a parameter c is in a range of 0.5 to 5, a value of a parameter d is in a range of 0 to 2.5, and the parameter d is an electrical charge of $M^{14}$.

$$M^{15}_3Al_5O_{12}:Ce \quad \text{(v)}$$

wherein $M^{15}$ is at least one selected from the group consisting of Y and Lu.

Examples of the fluorescent material having light emission peak wavelength in a wavelength range exceeding 680 nm specifically include fluorescent materials having any one of compositions represented by the following formulae (vi) to (x).

$$Al_2O_3:Cr \quad \text{(vi)}$$

$$CaYAlO_4:Mn \quad \text{(vii)}$$

$$LiAlO_2:Fe \quad \text{(viii)}$$

$$CdS:Ag \quad \text{(ix)}$$

$$GdAlO_3:Cr \quad \text{(x)}$$

The light emitting device 100 can be utilized as a light emitting device for plant cultivation that can activate photosynthesis of plants and promote growth of plants so as to have favorable form and weight.

Plant Cultivation Method

The plant cultivation method of one embodiment of the present disclosure is a method for cultivating plants, including irradiating plants with light emitted from the light emitting device 100. In the plant cultivation method, plants can be irradiated with light from the light emitting device 100 in plant factories that are completely isolated from external environment and make it possible for artificial control. The kind of plants is not particularly limited. However, the light emitting device 100 of one embodiment of the present disclosure can activate photosynthesis of plants and promote growth of plants such that a stem, a leaf, a root, a fruit have favorable form and weight, and therefore is preferably applied to cultivation of vegetables, flowers that contain much chlorophyll performing photosynthesis.

Examples of the vegetables include lettuces such as garden lettuce, curl lettuce, Lamb's lettuce, Romaine lettuce, endive, Lollo Rosso, Rucola lettuce, and frill lettuce; Asteraceae vegetables such as "shungiku" (*chrysanthemum coronarium*); morning glory vegetables such as spinach; Rosaceae vegetables such as strawberry; and flowers such as *chrysanthemum, gerbera*, rose, and tulip.

EXAMPLES

The present invention is further specifically described below by Examples and Comparative Examples.

Examples 1 to 5

First Fluorescent Material

Two fluorescent materials of fluorogarmanate fluorescent material that is activated by $Mn^{4+}$, having a light emission peak at 660 nm and fluorescent material containing silicon nitride that are activated by $Eu^{2+}$, having a light emission peak at 660 nm were used as the first fluorescent material 71. In the first fluorescent material 71, a mass ratio of a MGF fluorescent material to a CASN fluorescent material (MGF: CASN) was 95:5.

Second Fluorescent Material

Fluorescent material that is obtained by the following production method was used as the second fluorescent material 72.

55.73 g of $Y_2O_3$ ($Y_2O_3$ content: 100 mass %), 0.78 g of $CeO_2$ ($CeO_2$ content: 100 mass %), 0.54 g of $Cr_2O_3$ ($Cr_2O_3$ content: 100 mass %), and 42.95 g of $Al_2O_3$ ($Al_2O_3$ content: 100 mass %) were weighed as raw materials, and 5.00 g of $BaF_2$ as a flux was added to the mixture. The resulting raw materials were dry mixed for 1 hour by a ball mill. Thus, a raw material mixture was obtained.

The raw material mixture obtained was placed in an alumina crucible, and a lid was put on the alumina crucible. The raw material mixture was heat-treated at 1,500° C. for 10 hours in a reducing atmosphere of $H_2$: 3 vol % and $N_2$: 97 vol %. Thus, a calcined product was obtained. The calcined product was passed through a dry sieve to obtain a second fluorescent material. The second fluorescent material obtained was subjected to composition analysis by ICP-AES emission spectrometry using an inductively coupled plasma emission analyzer (manufactured by Perkin Elmer). The composition of the second fluorescent material obtained was $(Y_{0.977}Ce_{0.009}Cr_{0.014})_3Al_5O_{12}$ (hereinafter referred to as "YAG: Ce, Cr").

Light Emitting Device

Nitride semiconductor having a light emission peak wavelength of 450 nm was used as the light emitting element 10 in the light emitting device 100.

Silicone resin was used as a sealing material constituting the fluorescent member 50, the first fluorescent material 71 and/or the second fluorescent material 72 was added to 100 parts by mass of the silicone resin in the compounding ratio (parts by mass) shown in Table 1, and 15 parts by mass of silica filler were further added thereto, followed by mixing and dispersing. The resulting mixture was degassed to obtain a resin composition constituting a fluorescent member. In each of resin compositions of Examples 1 to 5, the compounding ratio of the first fluorescent material 71 and the second fluorescent material 72 was adjusted as shown in Table 1, and those materials are compounded such that the R/B ratio is within a range of 2.0 or more and 2.4 or less, and the R/FR ratio is within a range of 1.4 or more and 6.0 or less.

The resin composition was poured on the light emitting element 10 of a depressed portion of the molded article 40 to fill the depressed portion, and heated at 150° C. for 4 hours to cure the resin composition, thereby forming the fluorescent member 50. Thus, the light emitting device 100 as shown in FIG. 1 was produced in each of Examples 1 to 5.

Comparative Example 1

A light emitting device X including a semiconductor light emitting element having a light emission peak wavelength of 450 nm and a light emitting device Y including a semiconductor light emitting element having a light emission peak length of 660 nm were used, and the R/B ratio was adjusted to 2.5.

Evaluation

Photon Flux Density

Figure 2:
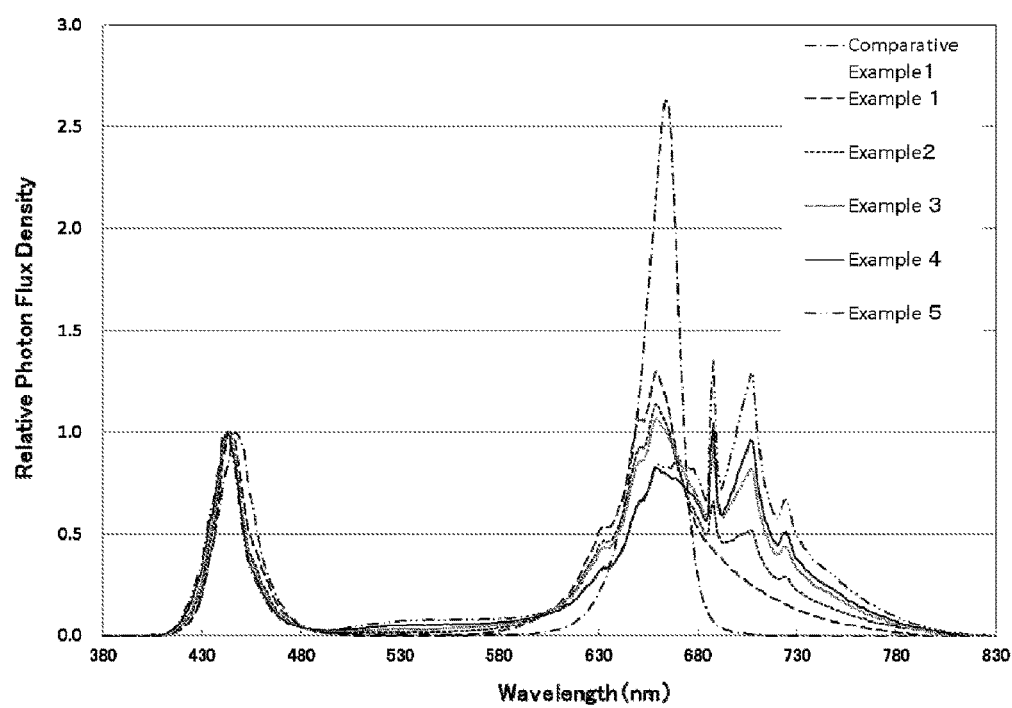
FIG. 2 is a diagram showing spectra of wavelengths and relative photon flux densities of exemplary light emitting devices according to embodiments of the present disclosure and a comparative light emitting devices.

Photon flux densities of lights emitted from the light emitting device 100 used in Examples 1 to 5 and the light emitting devices X and Y used in Comparative Example 1 were measured using a photon measuring device (LI-250A, manufactured by Li-COR). The photon flux density B, the photon flux density R, and the photon flux density FR of lights emitted from the light emitting devices used in each of the Examples and Comparative Example; the R/B ratio; and the R/FR ratio are shown in Table 1. FIG. 2 shows spectra showing the relationship between a wavelength and a relative photon flux density, in the light emitting devices used in each Example and Comparative Example.

Plant Cultivation Test

The plant cultivation method includes a method of conducting by "growth period by RGB light source (hereinafter referred to as a first growth period)" and "growth period by light source for plant growth (hereinafter referred to as a second growth period)" using a light emitting device according to an embodiment of the present disclosure as a light source.

The first growth period uses RGB light source, and RGB type LED generally known can be used as the RGB light source. The reason for irradiating plants with RGB type LED in the initial stage of the plant growth is that length of a stem and the number and size of true leaves in the initial stage of plant growth are made equal, thereby clarifying the influence by the difference of light quality in the second growth period.

The first growth period is preferably about 2 weeks. In the case where the first growth period is shorter than 2 weeks, it is necessary to confirm that two true leaves develop and a root reaches length that can surely absorb water in the second growth period. In the case where the first growth period exceeds 2 weeks, variation in the second growth period tends to increase. The variation is easy to be controlled by RGB light source by which stem extension is inhibitory, rather than a fluorescent lamp by which stem extension is easy to occur.

After completion of the first growth period, the second growth period immediately proceeds. It is preferred that plants are irradiated with light emitted from a light emitting device according to an embodiment of the present disclosure. Photosynthesis of plants is activated by irradiating plants with light emitted from the light emitting device according to an embodiment of the present disclosure, and the growth of plants can be promoted so as to have favorable form and weight.

The total growth period of the first growth period and the second growth period is about 4 to 6 weeks, and it is preferred that shippable plants can be obtained within the period.

The cultivation test was specifically conducted by the following method.

Romaine lettuce (green romaine, produced by Nakahara Seed Co., Ltd.) was used as cultivation plant.

First Growth Period

Figure 4:
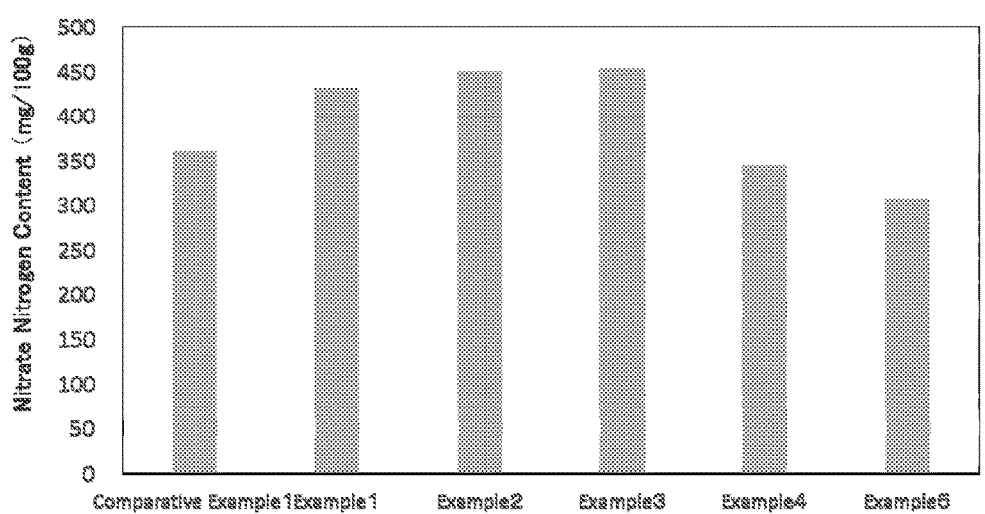
FIG. 4 is a graph showing nitrate nitrogen content in each plant grown by irradiating the plant with light from exemplary light emitting devices according to embodiments of the present disclosure and a comparative light emitting device.

Urethane sponges (salad urethane, manufactured by M Hydroponic Research Co., Ltd.) having Romaine lettuce seeded therein were placed side by side on a plastic tray, and were irradiated with light from RGB-LED light source (manufactured by Shibasaki Inc.) to cultivate plants. The plants were cultivated for 16 days under the conditions of Measurement of Nitrate Nitrogen Content The edible part (about 20 g) of each of the cultivated plants, from which a foot about 5 cm had been removed, was frozen with liquid nitrogen and crushed with a juice mixer (laboratory mixer LM-PLUS, manufactured by Osaka Chemical Co., Ltd.) for 1 minute. The resulting liquid was filtered with Miracloth (manufactured by Milipore), and the filtrate was centrifuged at 4° C. and 15,000 rpm for 5 minutes. The nitrate nitrogen content (mg/100 g) in the cultivated plant in the supernatant was measured using a portable reflection photometer system (product name: RQ flex system, manufactured by Merck) and a test paper (product name: Reflectoquant (registered trade mark), manufactured by Kanto Chemical Co., Inc.). The results are shown in Table 1 and FIG. 4.

TABLE 1

| | Fluorescent material (parts by mass) | | Photon flux density ($\mu mol \cdot m^{-2} \cdot s^{-1}$) | | | Ratio of photon flux densities | | Fresh weight (Edible part) | Nitrate nitrogen content |
|---|---|---|---|---|---|---|---|---|---|
| | First fluorescent material | Second fluorescent material | | | | | | | |
| | (MGF/CASN = 95:5) | (YAG: Ce, Cr) | B | R | FR | R/B | R/FR | (g) | (mg/100 g) |
| Comparative Example 1 | — | — | 35.5 | 88.8 | 0.0 | 2.5 | — | 26.2 | 361.2 |
| Example 1 | 60 | — | 31.5 | 74.9 | 12.6 | 2.4 | 6.0 | 35.4 | 430.8 |
| Example 2 | 50 | 10 | 28.5 | 67.1 | 21.7 | 2.4 | 3.1 | 34.0 | 450.0 |
| Example 3 | 40 | 20 | 25.8 | 62.0 | 28.7 | 2.4 | 2.2 | 33.8 | 452.4 |
| Example 4 | 30 | 30 | 26.8 | 54.7 | 33.5 | 2.0 | 1.6 | 33.8 | 345.0 |
| Example 5 | 25 | 39 | 23.4 | 52.8 | 38.1 | 2.3 | 1.4 | 28.8 | 307.2 | room temperature: 22 to 23° C., humidity: 50 to 60%, photon flux density from light emitting device: 100 $\mu mol \cdot m^{-2} \cdot s^{-1}$ and daytime hour: 16 hours/day. Only water was given until germination, and after the germination (about 4 days later), a solution obtained by mixing Otsuka House #1 (manufactured by Otsuka Chemical Co., Ltd.) and Otsuka House #2 (manufactured by Otsuka Chemical Co., Ltd.) in a mass ratio of 3:2 and dissolving the mixture in water was used as a nutrient solution (Otsuka Formulation A). Conductivity of the nutrient was 1.5 $ms \cdot cm^{-1}$.

Second Growth Period

After the first growth period, the plants were irradiated with light from the light emitting devices of Examples 1 to 5 and Comparative Example 1, and were subjected to hydroponics.

The plants were cultivated for 19 days under the conditions of room temperature: 22 to 24° C., humidity: 60 to 70%, $CO_2$ concentration: 600 to 700 ppm, photon flux density from light emitting device: 125 $\mu mol \cdot m^{-2} \cdot s^{-1}$ and daytime hour: 16 hours/day. Otsuka Formulation A was used as the nutrient solution. Conductivity of the nutrient was 1.5 $ms \cdot cm^{-1}$. The values of the R/B and R/FR ratios of light for plant irradiation from each light emitting device in the second growth period are shown in Table 1.

Measurement of Fresh Weight (Edible Part)

Figure 3:
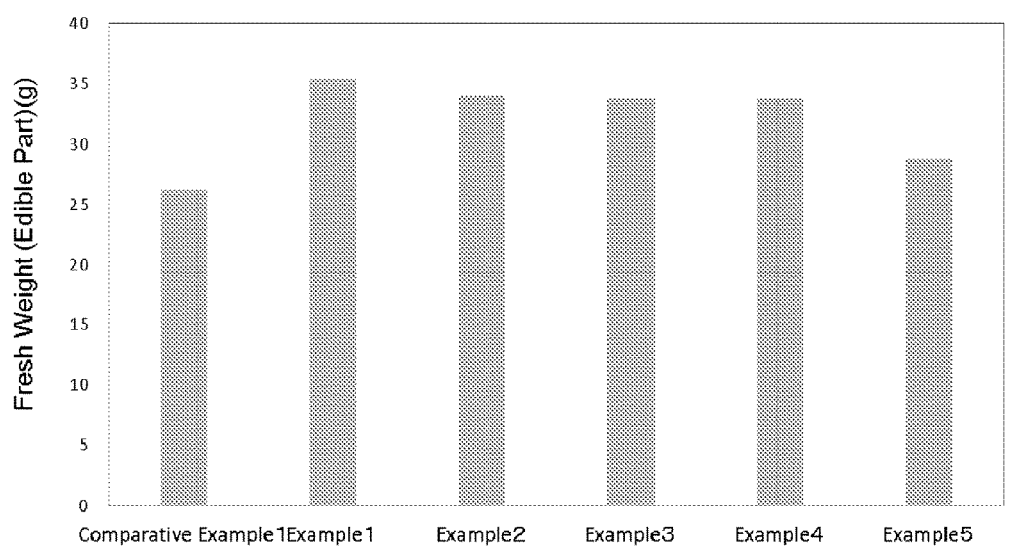
FIG. 3 is a graph showing fresh weight (edible part) at the harvest time of each plant grown by irradiating the plant with light from exemplary light emitting devices according to embodiments of the present disclosure and a comparative light emitting device.

The plants after cultivation were harvested, and wet weights of a terrestrial part and a root were measured. The wet weight of a terrestrial part of each of 6 cultivated plants having been subjected to hydroponics by irradiating with light from the light emitting devices of Examples 1 to 5 and Comparative Example 1 was measured as a fresh weight (edible part) (g). The results obtained are shown in Table 1 and FIG. 3.

As shown in Table 1, for the light emitting devices in Examples 1 to 5, the R/B ratios are within a range of 2.0 or more and 4.0 or less and the R/FR ratios are within the range of 0.7 or more and 13.0 or less. For Romaine lettuce cultivated by irradiating with light from the light emitting device in Examples 1 to 5, the fresh weight (edible part) was increased as compared with Romaine lettuce cultivated by irradiating with light from the light emitting device used in Comparative Example 1. Therefore, cultivation of plants was promoted, as shown in Table 1 and FIG. 3.

As shown in FIG. 2, the light emitting device 100 in Example 1 had at least one maximum value of the relative photon flux density in a range of 380 nm or more and 490 nm or less and in a range of 580 nm or more and less than 680 nm. The light emitting devices 100 in Examples 2 to 5 had at least one maximum value of relative photon flux density in a range of 380 nm or more and 490 nm or less, in a range of 580 nm or more and less than 680 nm and in a range of 680 nm or more and 800 nm or less, respectively. The maximum value of the relative photon flux density in a range of 380 nm or more and 490 nm or less is due to the light emission of the light emitting element having light emission peak wavelength in a range of 380 nm or more and 490 nm or less, the maximum value of the relative photon flux density in a range of 580 nm or more and less than 680 nm is due to the first fluorescent material emitting the light having at least one light emission peak wavelength in a range of 580 nm or more and less than 680 nm, and the maximum value of the relative photon flux density in a range of 680 nm or more and 800 nm or less is due to the second fluorescent material emitting the light having at least one light emission peak wavelength in a range of 680 nm or more and 800 nm or less.

As shown in Table 1, for the light emitting devices 100 in Examples 4 and 5, the R/B ratios are 2.0 and 2.3, respectively, and the R/FR ratios are 1.6 and 1.4, respectively. The R/B ratios are within a range of 2.0 or more and 4.0 or less, and the R/FR ratios are within a range of 0.7 or more and 2.0 or less. For Romaine lettuces cultivated by irradiating with lights from the light emitting devices 100, the nitrate nitrogen content is decreased as compared with Comparative Example 1. Plants, in which the nitrate nitrogen content having the possibility of adversely affecting health of human body had been reduced to a range that does not inhibit the cultivation of plants, could be cultivated, as shown in Table 1 and FIG. 4.

The light emitting device according to an embodiment of the present disclosure can be utilized as a light emitting device for plant cultivation that can activate photosynthesis and is capable of promoting growth of plants. Furthermore, the plant cultivation method, in which plants are irradiated with the light emitted from the light emitting device according to an embodiment of the present disclosure, can cultivate plants that can be harvested in a relatively short period of time and can be used in a plant factory.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising:
   a light emitting element having a light emission peak wavelength in a range of 380 nm or more and 490 nm or less; and
   a first fluorescent material that is excited by light from the light emitting element and emits light having at least one light emission peak wavelength in a range of 580 nm or more and less than 680 nm, wherein the first fluorescent material contains:
      a fluorogermanate fluorescent material that is activated by $Mn^{4+}$, and
      a fluorescent material that has a composition containing at least one element selected from Sr and Ca, and Al, and contains silicon nitride that is activated by $Eu^{2+}$; and
   a second fluorescent material that is excited by light from the light emitting element and emits light having at least one light emission peak wavelength in a range of 680 nm or more and 800 nm or less, wherein
   the light emitting device emits light having a ratio RB of a photon flux density R to a photon flux density B within a range of 2.0 or more and 4.0 or less, and a ratio R/FR of the photon flux density R to a photon flux density FR within a range of 0.7 or more and 2.0 or less, wherein
      the photon flux density R is in a wavelength range of 620 nm or more and less than 700 nm,
      the photon flux density B is in a wavelength range of 380 nm or more and 490 nm or less, and
      the photon flux density FR is in a wavelength range of 700 nm or more and 780 nm or less.

2. The light emitting device according to claim 1, wherein the second fluorescent material contains a first element Ln containing at least one element selected from the group consisting of rare earth elements excluding Ce, a second element M containing at least one element selected from the group consisting of Al, Ga and In, Ce, and Cr, and has a composition of an aluminate fluorescent material, and
   when a molar ratio of the second element M is taken as 5, a molar ratio of Ce is a product of a value of a parameter x and 3, and a molar ratio of Cr is a product of a value of a parameter y and 3, the value of the parameter x being in a range of exceeding 0.0002 and less than 0.50, and the value of the parameter y being in a range of exceeding 0.0001 and less than 0.05.

3. The light emitting device according to claim 1, wherein the second fluorescent material has the composition represented by the following formula (I):

$$(Ln_{1-x-y}Ce_xCr_y)_3M_5O_{12} \qquad (I)$$

wherein Ln is at least one rare earth element selected from the group consisting of rare earth elements excluding Ce,
M is at least one element selected from the group consisting of Al, Ga, and In, and
x and y are numbers satisfying 0.0002<x<0.50 and 0.0001<y<0.05.

4. The light emitting device according to claim 1, wherein
a mass ratio between the fluorogermanate fluorescent material and the fluorescent material containing silicon nitride (fluorogermanate fluorescent material:fluorescent material containing silicon nitride) is in a range of 50:50 or more and 99:1 or less.

5. The light emitting device according to claim 1, the light emitting device being used in plant cultivation.

6. A plant cultivation method comprising irradiating plants with light emitted from the light emitting device according to claim 1.

* * * * *